(12) United States Patent
Ozawa et al.

(10) Patent No.: US 9,093,952 B2
(45) Date of Patent: Jul. 28, 2015

(54) SEMICONDUCTOR DEVICE AND CONTROL METHOD THEREOF

(71) Applicant: Renesas Electronics Corporation, Kawasaki-shi, Kanagawa (JP)

(72) Inventors: Osamu Ozawa, Kanagawa (JP); Masashi Horiguchi, Kanagawa (JP); Takayasu Ito, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 33 days.

(21) Appl. No.: 13/952,579

(22) Filed: Jul. 26, 2013

(65) Prior Publication Data

US 2014/0035689 A1 Feb. 6, 2014

(30) Foreign Application Priority Data

Jul. 31, 2012 (JP) ................................. 2012-170337

(51) Int. Cl.
*H03B 5/36* (2006.01)

(52) U.S. Cl.
CPC ................. *H03B 5/364* (2013.01); *H03B 5/36* (2013.01); *H03B 5/366* (2013.01); *H03B 2200/005* (2013.01); *H03B 2200/0046* (2013.01); *H03B 2200/0082* (2013.01); *H03B 2200/0088* (2013.01); *H03B 2200/0094* (2013.01)

(58) Field of Classification Search
CPC .......... H03B 5/362; H03B 5/364; H03B 5/36; H03B 5/32; H03B 2200/005; H03B 2200/0046; H03B 2200/0082; H03B 2200/0062
USPC .......................... 331/116 R, 116 FE, 158, 160
See application file for complete search history.

(56) References Cited

U.S. PATENT DOCUMENTS

| | | | | |
|---|---|---|---|---|
| 6,888,418 B2 * | 5/2005 | Yin | ................................ | 331/158 |
| 6,943,639 B2 * | 9/2005 | Dahlin | ........................ | 331/183 |
| 7,844,837 B2 * | 11/2010 | Youssef | ........................ | 713/194 |
| 8,558,630 B2 * | 10/2013 | Souma | ........................... | 331/158 |
| 8,644,781 B2 * | 2/2014 | Kuo et al. | ..................... | 455/255 |
| 2005/0007205 A1 | 1/2005 | Bridger | | |
| 2006/0030358 A1 | 2/2006 | Kappes | | |
| 2008/0238561 A1 * | 10/2008 | Otsuka et al. | ................. | 331/158 |
| 2009/0261914 A1 | 10/2009 | Kao et al. | | |
| 2012/0098609 A1 | 4/2012 | Verma et al. | | |

FOREIGN PATENT DOCUMENTS

| | | |
|---|---|---|
| JP | 2001-136030 A | 5/2001 |
| JP | 2008-103808 A | 5/2008 |
| JP | 2009-105611 A | 5/2009 |

OTHER PUBLICATIONS

Extended European search report issued Feb. 3, 2014, in European Patent Application No. 13178181.7.

* cited by examiner

*Primary Examiner* — Ryan Johnson
(74) *Attorney, Agent, or Firm* — Miles & Stockbridge P.C.

(57) ABSTRACT

The present invention provides a semiconductor device including a first terminal and a second terminal respectively coupled to both ends of a crystal resonator, an inverter circuit having an input coupled to the first terminal and an output coupled to the second terminal, a feedback resistor which couples between the first terminal and the second terminal, a variable capacitor coupled to at least one of the first and second terminals, and a control circuit. The control circuit performs control to increase both of the drive capability of the inverter circuit and the capacitance value of the variable capacitor in a second mode rather than a first mode.

13 Claims, 17 Drawing Sheets

SEMICONDUCTOR DEVICE AND CONTROL METHOD THEREOF

CROSS-REFERENCE TO RELATED APPLICATIONS

The disclosure of Japanese Patent Application No. 2012-170337 filed on Jul. 31, 2012 including the specification, drawings and abstract is incorporated herein by reference in its entirety.

BACKGROUND

The present invention relates to a semiconductor device equipped with an oscillator circuit, and a control method thereof.

A clock signal used in a semiconductor device is generated typically by using a crystal resonator and an oscillator circuit. It is desirable that noise immunity of the oscillator circuit is high to obtain a stable clock signal.

A Patent Document 1 has disclosed an oscillator circuit. The oscillator circuit has an inverter having a transistor, a feedback resistor, capacitive elements, a variable current source, a timer circuit, and a current controller. The feedback resistor is coupled in parallel with the inverter. The capacitive elements are respectively provided on the input and output sides of the inverter. The variable current source supplies either of two types of currents different in level to the inverter. The timer circuit counts a prescribed time from the start-up of a power supply for the oscillator circuit. The current controller controls the variable current source in such a manner that it supplies the current large in level, of the two types of currents suppliable by the variable current source to the inverter during a period taken until the count time by the timer circuit goes beyond a predetermined time and that after it has gone beyond the predetermined time, it supplies the current small in level to the inverter.

A Patent Document 2 has disclosed a crystal oscillator circuit in which a power supply line is made identical with other electronic circuits. A low-pass filter for preventing noise superimposed on the power supply line from entering the crystal oscillator circuit is provided between the power supply line and the crystal oscillator circuit.

A Patent Document 3 has disclosed a crystal oscillator. The crystal oscillator is equipped with a crystal oscillator circuit and a buffer circuit. The crystal oscillator circuit is coupled to a power supply circuit and takes the output of a control voltage generating circuit as an input. The buffer circuit is coupled to the power supply circuit and takes the output of the crystal oscillator circuit as an input. Further, a low-pass filter is coupled between the power supply circuit and the buffer circuit.

RELATED ART DOCUMENTS

Patent Document

[Patent Document 1] Japanese Unexamined Patent Publication Laid-Open No. 2009-105611
[Patent Document 2] Japanese Unexamined Patent Publication Laid-Open No. 2001-136030
[Patent Document 3] Japanese Unexamined Patent Publication Laid-Open No. 2008-103808

SUMMARY

Driving small capacity capacitors with low current is effective to suppress power consumption of an oscillator circuit. Such small capacity capacitors are however low in immunity against noise and environmental variations such as fluctuations in power supply voltage, etc. Thus, when the oscillator circuit is implemented in a product chip, such small capacity capacitors have a potential for becoming a cause of a malfunction of the oscillator circuit. Compatibility of low power consumption and high noise immunity has been desired for the oscillator circuit.

Other objects and novel features of the present invention will become apparent from the description of the present specification and the accompanying drawings.

In one embodiment, a semiconductor device is provided. The semiconductor device is provided with a first terminal and a second terminal respectively coupled to both ends of a crystal resonator. The semiconductor device is further provided with an inverter circuit, a feedback resistor, a variable capacitor and a control circuit. The input of the inverter circuit is coupled to the first terminal, and its output is coupled to the second terminal. The feedback resistor couples between the first terminal and the second terminal. The variable capacitor is coupled to at least one of the first terminal and the second terminal. The control circuit controls the drive capability of the inverter circuit and the capacitance value of the variable capacitor, based on a mode signal which specifies each of a first mode and a second mode. More specifically, the control circuit performs control to increase both of the drive capability of the inverter circuit and the capacitance value of the variable capacitor in the second mode rather than the first mode.

In one embodiment, a control method of a semiconductor device is provided. The semiconductor device is provided with a first terminal and a second terminal respectively coupled to both ends of a crystal resonator, an inverter circuit having an input coupled to the first terminal and an output coupled to the second terminal, a feedback resistor which couples between the first terminal and the second terminal, and a variable capacitor coupled to at least one of the first and second terminals. The control method includes (A) a step of switching an operating mode between a first mode and a second mode, and (B) a step of performing control in such a manner that both of the drive capability of the inverter circuit and the capacitance value of the variable capacitor become larger in the second mode than in the first mode.

Compatibility of low power consumption and high noise immunity can be realized with respect to an oscillator circuit.

DETAILED DESCRIPTION

1. Oscillator circuit 1-1. Basic Configuration

Figure 1:
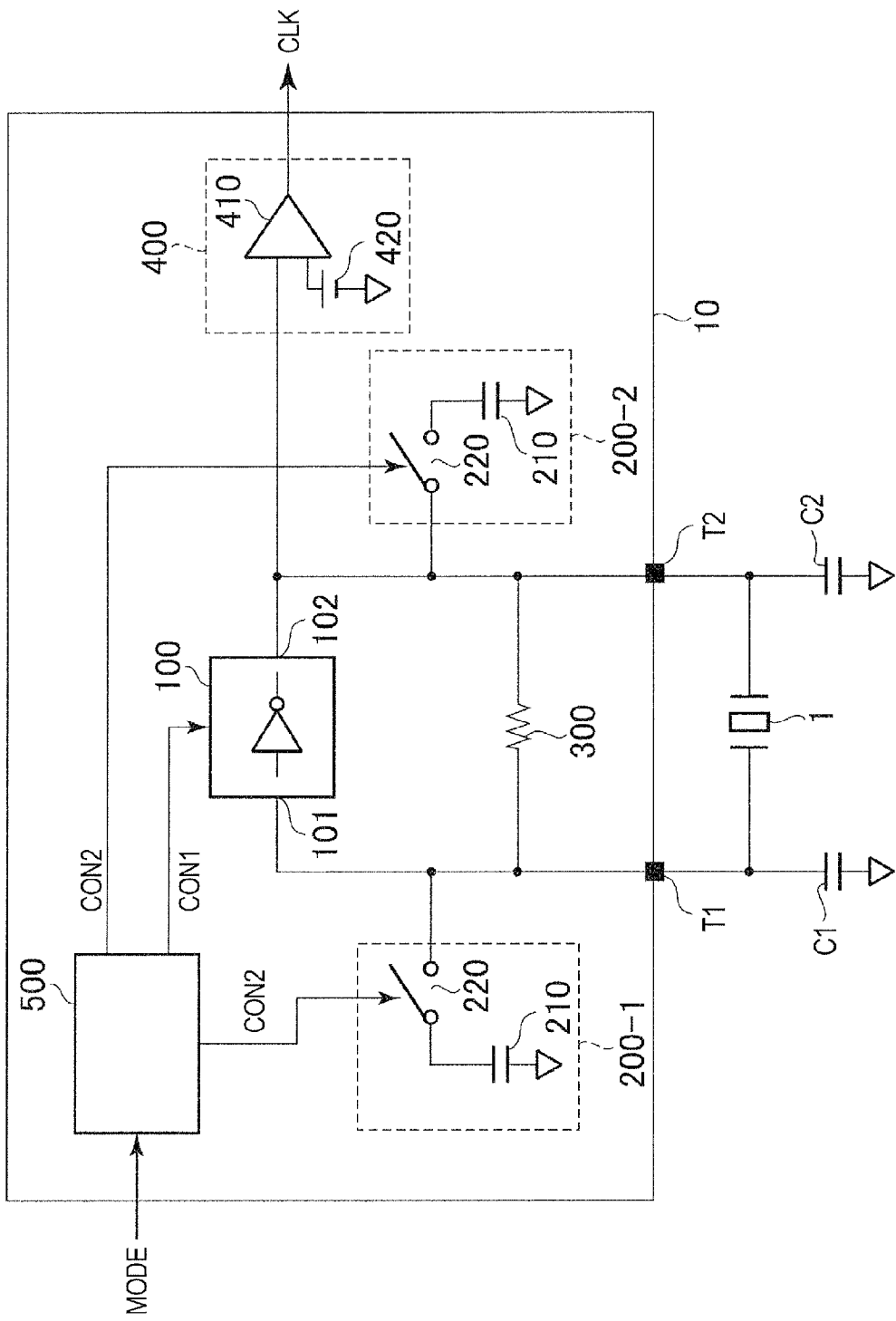
FIG. 1 is a circuit diagram showing a configuration of an oscillator circuit according to an embodiment of the present invention.

FIG. 1 is a circuit diagram showing a configuration of an oscillator circuit 10 according to an embodiment of the present invention. The oscillator circuit 10 is coupled to a crystal resonator 1, a first capacitor C1 and a second capacitor C2 that are external parts. More specifically, the oscillator circuit 10 has a first terminal T1 and a second terminal T2. The first terminal T1 and the second terminal T2 are respectively coupled to both ends of the crystal resonator 1. The first capacitor C1 is coupled between the first terminal T1 and a ground terminal. The second capacitor C2 is coupled between the second terminal T2 and the ground terminal. The oscillator circuit 10 operates in conjunction with these crystal resonator 1, first capacitor C1 and second capacitor C2 and thereby generates and outputs a clock signal CLK.

The oscillator circuit 10 is provided with an inverter circuit 100, a feedback resistor 300 and a comparator circuit 400.

The inverter circuit 100 has an inverting logic function and performs logic inversion between an input terminal 101 and an output terminal 102. The input terminal 101 and the output terminal 102 of the inverter circuit 100 are respectively coupled to the first terminal T1 and the second terminal T2. Incidentally, as will be described later, the drive capability of the inverter circuit 100 according to the present embodiment can be variably controlled.

The feedback resistor 300 is provided to couple between the first terminal T1 and the second terminal T2. The crystal resonator 1, first capacitor C1, second capacitor C2, inverter circuit 100 and feedback resistor 300 described above generates oscillating operations as with a typical oscillator circuit.

An input of the comparator circuit 400 is coupled to the second terminal T2 (the output terminal 102 of the inverter circuit 100). The comparator circuit 400 generates a clock signal CLK, based on a voltage (oscillation voltage waveform) of the second terminal T2 and outputs the generated clock signal CLK. For example, the comparator circuit 400 is provided with a comparator 410 and a reference voltage power supply 420. The reference voltage power supply 420 generates a reference voltage. The reference voltage and the voltage of the second terminal T2 are inputted to the comparator 410, so that the clock signal CLK is generated.

The oscillator circuit 10 according to the present embodiment is further provided with variable capacitors 200 and a control circuit 500.

The variable capacitor 200 is coupled to at least one of the first terminal T1 and the second terminal T2. In the example shown in FIG. 1, a first variable capacitor 200-1 is coupled to the first terminal T1, and a second variable capacitor 200-2 is coupled to the second terminal T2. A capacitance value coupled to the first terminal T1 (second terminal T2) can be variably controlled by controlling the capacitance value of the first variable capacitor 200-1 (second variable capacitor 200-2). For example, each variable capacitor 200 is provided with a capacitor 210 and a switch 220. The capacitance value of the capacitor 210 is 10 pF, for example. The switch 220 is interposed between the capacitor 210 and the first terminal T1 (second terminal T2). The capacitance value coupled to the first terminal T1 (second terminal T2) can be variably controlled by ON/OFF-controlling the switch 220.

In the present embodiment, the drive capability of the inverter circuit 100 and the capacitance value of each variable capacitor 200 can be variably controlled. The control circuit 500 performs its variable control. Specifically, the control circuit 500 outputs a first control signal CON1 to the inverter circuit 100 and thereby controls the drive capability of the inverter circuit 100. Also the control circuit 500 outputs a second control signal CON2 to the respective variable capacitors 200 and thereby controls the capacitance values of the variable capacitors 200.

The control by the control circuit 500 is performed based on a mode signal MODE. The mode signal MODE specifies either of a "first mode" and a "second mode". The control circuit 500 outputs the first control signal CON1 and the second control signal CON2 in response to the content (first mode or second mode) of the mode signal MODE. That is, the control circuit 500 controls the drive capability of the inverter circuit 100 and the capacitance value of each variable capacitor 200 in response to the mode signal MODE.

1-2. Operations and Effects

Figure 2:
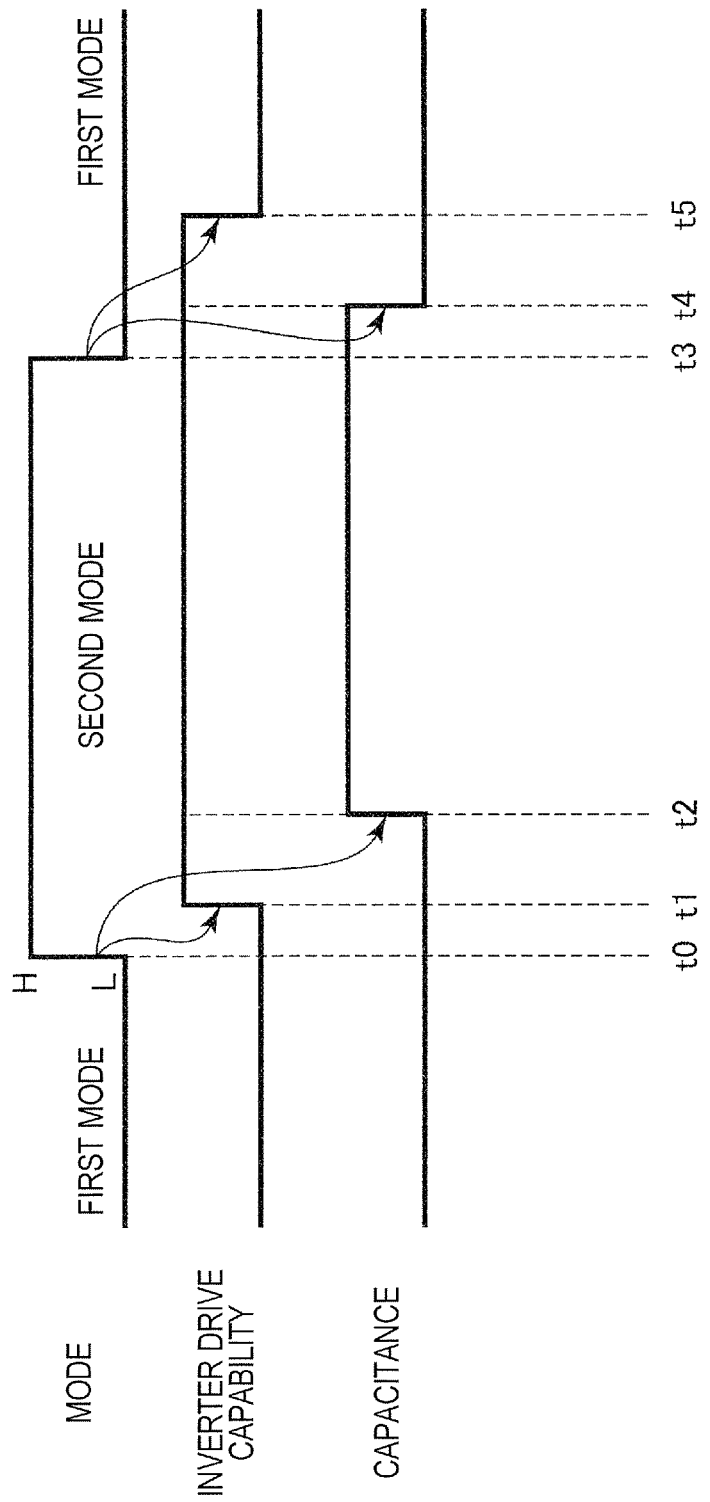
FIG. 2 is a timing chart illustrating a control method of the oscillator circuit according to the embodiment of the present invention.

FIG. 2 is a timing chart showing a control method of the oscillator circuit 10 according to the present embodiment. In the present embodiment, a mode signal MODE of a Low level indicates a first mode, and a mode signal MODE of a High level indicates a second mode.

At a time t0, the mode signal MODE is changed from the Low level to the High level. Thus, an operating mode is changed from the first mode to the second mode. In this case, the control circuit 500 performs control to increase "both" of the drive capability of the inverter circuit 100 and the capacitance value of each variable capacitor 200. That is, both of the drive capability of the inverter circuit 100 and the capacitance value of the variable capacitor 200 become larger in the second mode than in the first mode. As a result, since the drive current and load capacity of the oscillator circuit increase in the second mode, noise immunity of the oscillator circuit 10 is greatly improved.

Here, since the load capacity becomes larger than the drive current when the capacitance value of each variable capacitor 200 increases before the increase in the drive capability of the inverter circuit 100, the amplitude of an oscillation voltage becomes small and oscillation stability is degraded. In the worst case, there is also a possibility that the oscillations will stop. In terms of the maintenance of oscillations, the control circuit 500 preferably performs the following control upon switching from the first mode to the second mode. That is, the control circuit 500 increases the drive capability of the inverter circuit 100 at a time t1 subsequent to the time t0 and further increases the capacitance value of the variable capacitor 200 at a time t2 subsequent to the time t1. Thus, since the load capacity increases after the drive current has increased, degradation in the oscillation stability is prevented without the amplitude of the oscillation voltage being extremely reduced.

At a time t3, the mode signal MODE is switched from the High level to the Low level. Thus, the operating mode is switched from the second mode to the first mode. In this case, the control circuit 500 performs control to decrease "both" of the drive capability of the inverter circuit 100 and the capacitance value of each variable capacitor 200. Even here, in terms of the maintenance of oscillations, the control circuit 500 preferably performs the following control. That is, the control circuit 500 decreases the capacitance value of the variable capacitor 200 at a time t4 subsequent to the time t3 and further reduces the drive capability of the inverter circuit 100 at a time t5 subsequent to the time t4. Thus, since the load capacity is reduced before the drive current is reduced, degradation in the oscillation stability is prevented from occurring.

According to the present embodiment as described above, both of the drive current and load capacity of the oscillator circuit 10 become larger in the second mode than in the first mode. As a result, in the second mode, noise immunity of the oscillator circuit 10 is greatly improved. On the other hand, since both of the load capacity and the drive current are small, power consumption is suppressed. That is, it can also be said that the first mode is a "low power mode" and the second mode is a "high noise-immunity mode".

Driving small capacity capacitors (C1 and C2) with low current is effective to suppress the power consumption of the oscillator circuit 10. The suppression of the power consumption is realized by the first mode. For example, when only a timer (RTC circuit) built in a semiconductor device is operated at standby, it is considered that the operating mode is set to the first mode. It is thus possible to lengthen a battery drive time at standby.

On the other hand, such small capacity capacitors (C1 and C2) are low in immunity against noise and environmental variations such as fluctuations in power supply voltage, etc. When the oscillator circuit 10 is implemented in a product chip, such small capacity capacitors (C1 and C2) have a potential for becoming a cause of a malfunction in the oscillator circuit 10. Thus, when high noise immunity is desired, the second mode is preferably used. Since the drive current and the load capacity increase, the noise immunity of the oscillator circuit 10 is greatly improved.

Properly using the first and second modes depending on the circumstances in this manner enables compatibility between low power consumption and high noise immunity.

1-3. Modification

Figure 3:
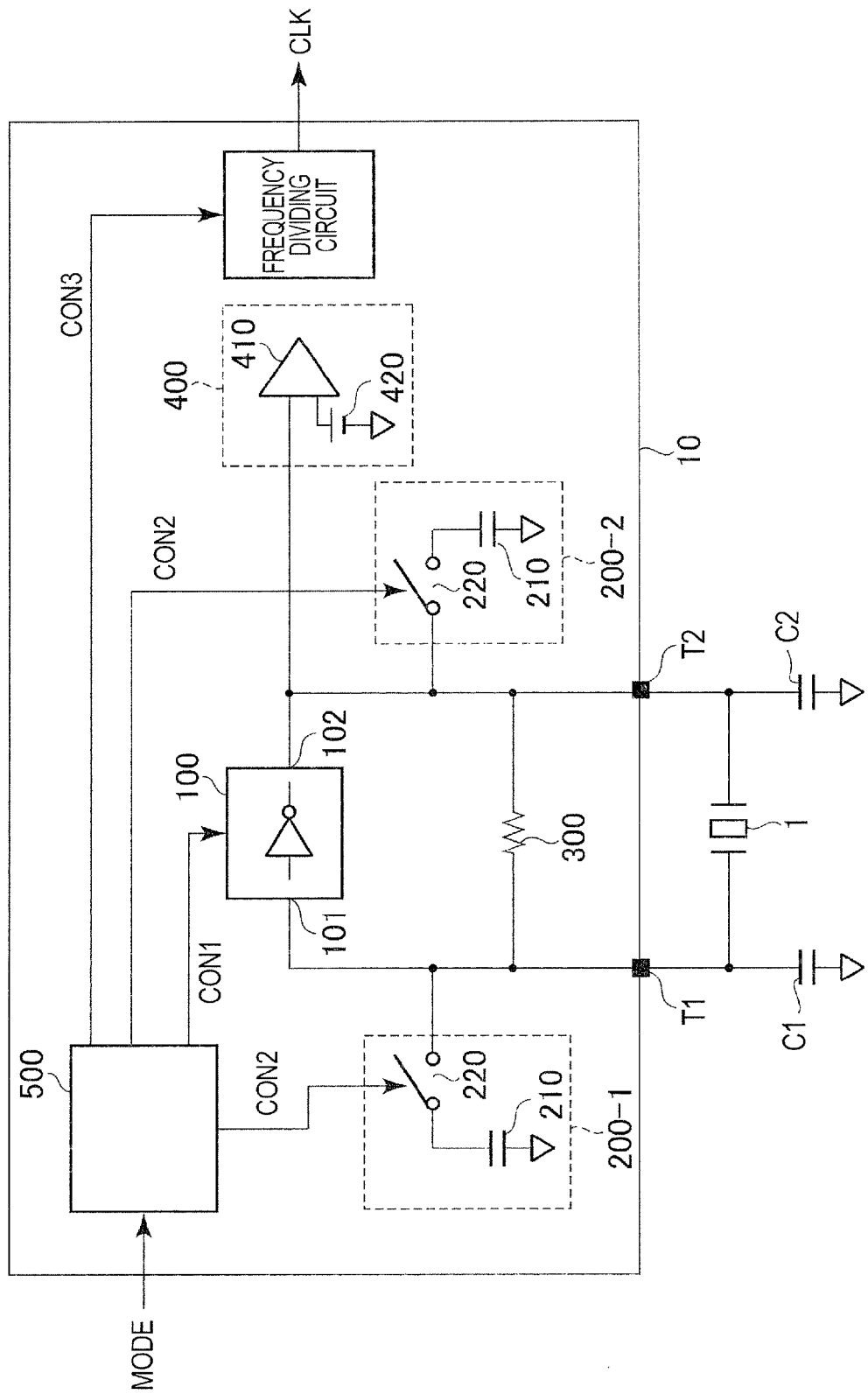
FIG. 3 is a circuit diagram depicting a modification of the oscillator circuit according to the embodiment of the present invention.
Figure 4:
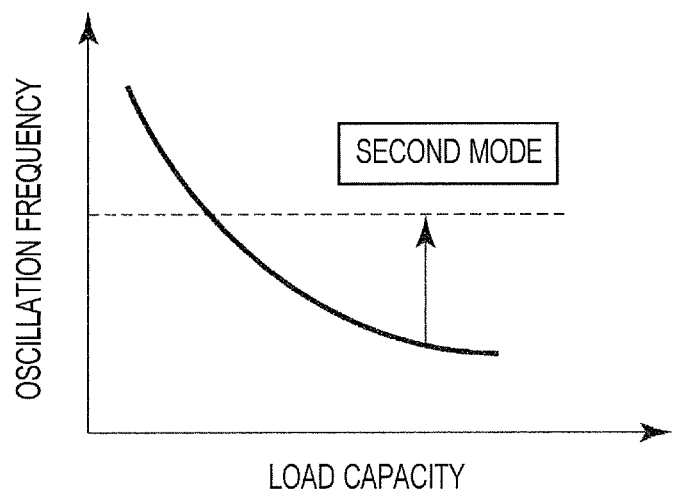
FIG. 4 is a conceptual diagram for describing the operation of a frequency dividing circuit.

FIG. 3 is a circuit diagram showing a modification of the oscillator circuit 10. As described above, in the present embodiment, the load capacity of the oscillator circuit 10 changes according to the first and second modes. Since a resonant condition varies with the change in the load capacity thereof, its oscillation frequency also changes. Specifically, as shown in FIG. 4, when the load capacity increases, the oscillation frequency is reduced. The reduction in the oscillation frequency means that the frequency of the clock signal CLK outputted from the comparator circuit 400 is lowered. That is, when the operating mode is switched from the first mode to the second mode, the frequency of the clock signal CLK outputted from the comparator circuit 400 is reduced.

Thus, a frequency dividing circuit 600 may be provided in a stage subsequent to the comparator circuit 400 as shown in FIG. 3 to keep the clock frequency constant without depending on the operating mode. The frequency dividing circuit 600 performs a frequency division of the clock signal CLK outputted from the comparator circuit 400 and thereby adjusts a clock frequency. More specifically, the frequency dividing circuit 600 performs switching of a frequency dividing ratio in such a manner that the frequency of the clock signal CLK becomes identical between the first mode and the second mode.

The above control circuit 500 performs switching of the frequency dividing ratio of the frequency dividing circuit 600. The control circuit 500 outputs a third control signal CON3 corresponding to the mode signal MODE to the frequency dividing circuit 600 and thereby performs switching of the frequency dividing ratio of the frequency dividing circuit 600. Specifically, the control circuit 500 performs switching of the frequency dividing ratio of the frequency dividing ratio 600 in such a manner than the frequency of the clock signal CLK becomes identical between the first mode and the second mode. Thus, a clock signal CLK having a constant frequency is outputted from the oscillator circuit 10.

1-4. Various Examples of Inverter Circuit

As mentioned above, the drive capability of the inverter circuit 100 is variably controlled by the first control signal CON1. Various configuration examples are considered as for such an inverter circuit 100.

Figure 5:
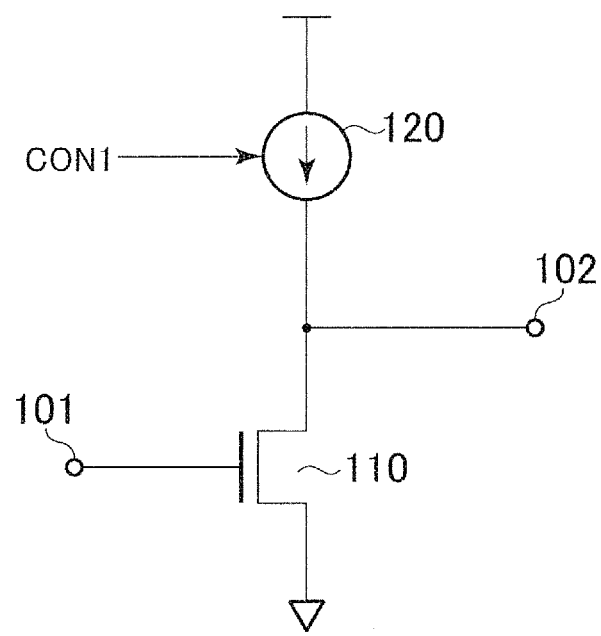
FIG. 5 is a circuit diagram showing a configuration example of an inverter circuit in the oscillator circuit according to the embodiment of the present invention.

FIG. 5 shows one configuration example of the inverter circuit 100. In the example shown in FIG. 5, the inverter circuit 100 is provided with an NMOS transistor 110 and a variable current source 120. The gate, drain and source of the NMOS transistor 110 are respectively coupled to an input terminal 101 (first terminal T1), an output terminal 102 (second terminal T2) and a ground terminal. The variable current source 120 supplies current to the drain of the NMOS transistor 110, i.e., the output terminal 102 (second terminal T2).

The current supplied from the variable current source 120 is controlled by the first control signal CON1 outputted from the control circuit 500. Specifically, the current of the variable current source 120 is controlled so as to be larger in the second mode than in the first mode. Thus, the drive capability of the inverter circuit 100 becomes larger in the second mode than in the first mode.

Figure 6:
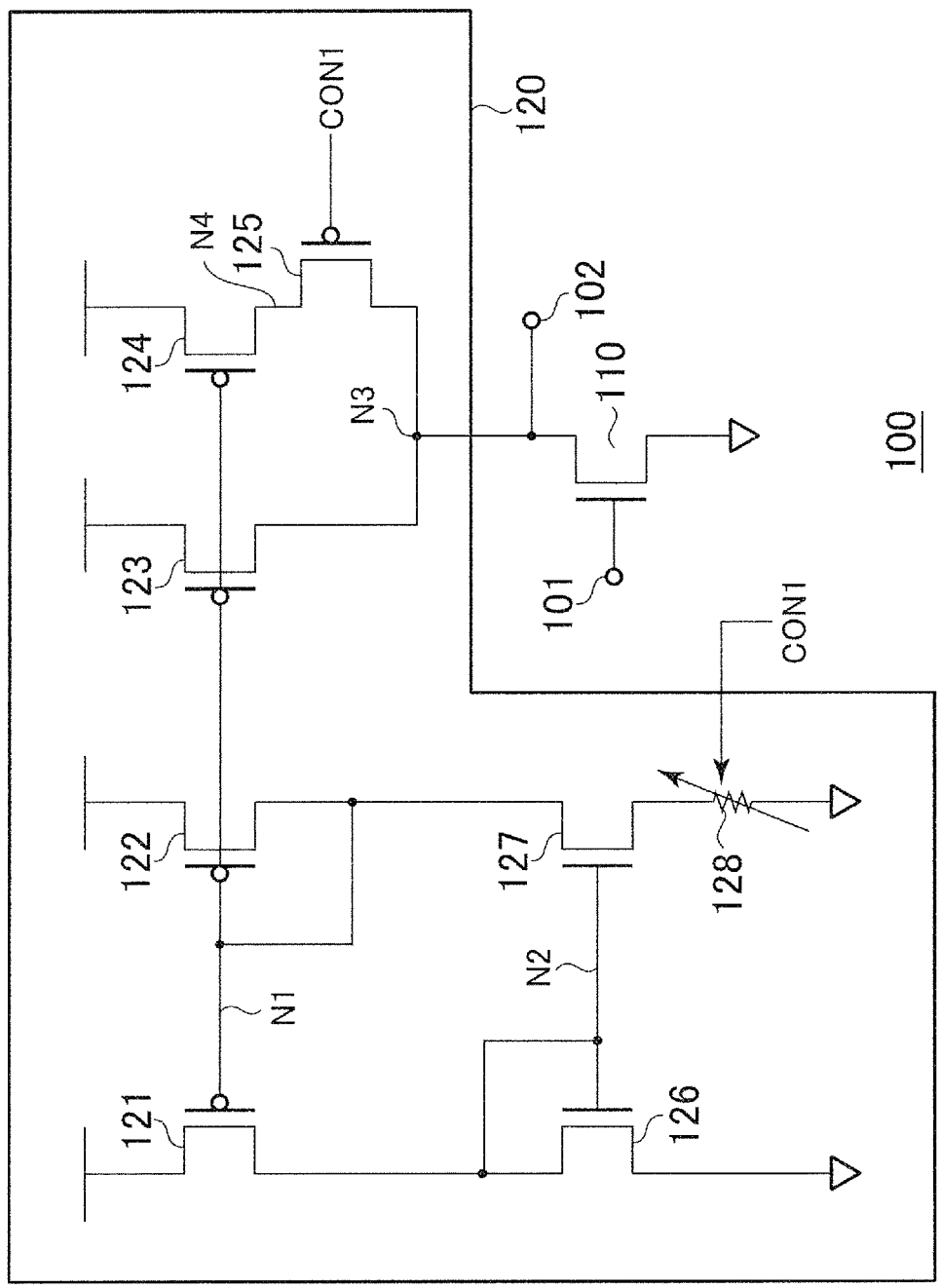
FIG. 6 is a circuit diagram illustrating the configuration example of the inverter circuit in the oscillator circuit according to the embodiment of the present invention.

FIG. 6 shows a configuration example of the variable current source 120. The variable current source 120 is provided with PMOS transistors 121 through 125, NMOS transistors 126 and 127 and a variable resistor 128.

The gates of the PMOS transistors 121 through 124 are coupled in common to a node N1. The sources of the PMOS transistors 121 through 124 are coupled to a power supply terminal. The drain of the PMOS transistor 121 is coupled to a node N2. The drain of the PMOS transistor 122 is coupled to the node N1. The drain of the PMOS transistor 123 is coupled to a node N3. The drain of the PMOS transistor 124 is coupled to a node N4.

The drain of the PMOS transistor 125 is coupled to the node N3, and the source thereof is coupled to the node N4. The first control signal CON1 is inputted to the gate of the PMOS transistor 125. That is, the PMOS transistor 125 is ON/OFF-controlled by the first control signal CON1.

The gate and drain of the NMOS transistor 126 are both coupled to the node N2. The source of the NMOS transistor 126 is coupled to a ground terminal. The gate of the NMOS transistor 127 is coupled to the node N2, and the drain thereof is coupled to the node N1. The source of the NMOS transistor 127 is coupled to the ground terminal through the variable resistor 128. A resistance value of the variable resistor 128 is variably controlled by the first control signal CON1.

The variable current source 120 is configured by such a current mirror circuit. A mirror ratio of the current mirror circuit can be switched by ON/OFF-controlling the PMOS transistor 125 using the first control signal CON1. Alternatively, a reference current of the current mirror circuit can be switched by controlling the resistance value of the variable resistor 128 using the first control signal CON1. The supply current of the variable current source 120 can be switched by such switching of the mirror ratio and/or reference current.

Figure 7:
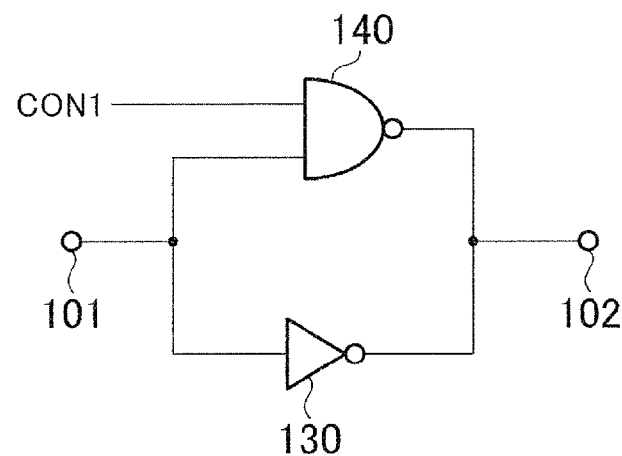
FIG. 7 is a circuit diagram showing another configuration example of the inverter circuit in the oscillator circuit according to the embodiment of the present invention.

FIG. 7 shows another configuration example of the inverter circuit 100. In the example shown in FIG. 7, the inverter circuit 100 is provided with an inverter 130 and a NAND gate 140. An input terminal and an output terminal of the inverter 130 are respectively coupled to an input terminal 101 (first terminal T1) and an output terminal 102 (second terminal T2). One of input terminals of the NAND gate 140 is coupled to the input terminal 101 (first terminal T1), and the other thereof is inputted with the first control signal CON1. An output terminal of the NAND gate 140 is coupled to the output terminal 102 (second terminal T2).

When the first control signal CON1 is a Low level, the output of the NAND gate 140 is fixed. On the other hand, when the first control signal CON1 is a High level, the NAND gate 140 functions as an inverter. In this case, the drive capability of the entire inverter circuit 100 increases. That is, the drive capability of the entire inverter circuit 100 can be switched in response to the first control signal CON1.

Figure 8:
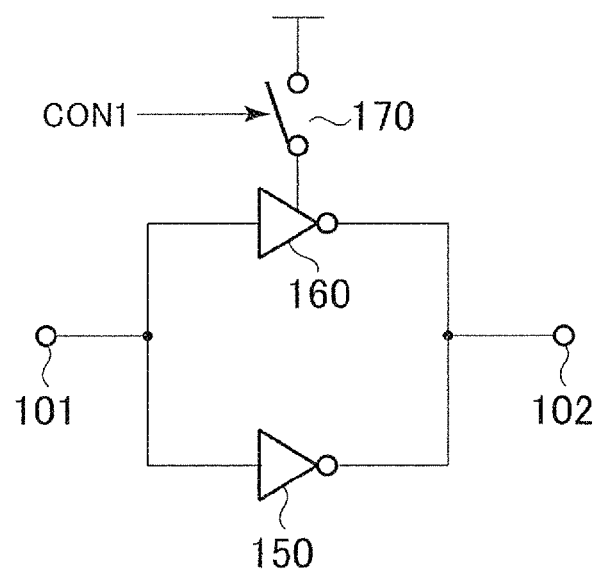
FIG. 8 is a circuit diagram illustrating a further configuration example of the inverter circuit in the oscillator circuit according to the embodiment of the present invention.

FIG. 8 shows a further configuration example of the inverter circuit 100. In the example shown in FIG. 8, the inverter circuit 100 is provided with inverters 150 and 160 and a switch 170. Respective input terminals of the inverters 150 and 160 are coupled to an input terminal 101 (first terminal T1). On the other hand, respective output terminals of the inverters 150 and 160 are coupled to an output terminal 102 (second terminal T2). Further, the switch 170 is interposed between the inverter 160 and a power supply terminal.

The switch 170 is ON/OFF-controlled by the first control signal CON1. When the switch 170 is ON, the inverter 160 operates, whereas when the switch 170 is OFF, the inverter 160 does not operate. Thus, the drive capability of the entire inverter circuit 100 can be switched in response to the first control signal CON1.

1-5. Various Examples of Variable Capacitor

In the already-mentioned example of FIG. 1, the first variable capacitor 200-1 has been coupled to the first terminal T1, and the second variable capacitor 200-2 has been coupled to the second terminal T2. The layout of each variable capacitor 200 is however not limited to it. The variable capacitor 200 may be coupled to at least one of the first terminal T1 and the second terminal T2, whereby the effect of improving noise immunity is obtained.

Figure 9:
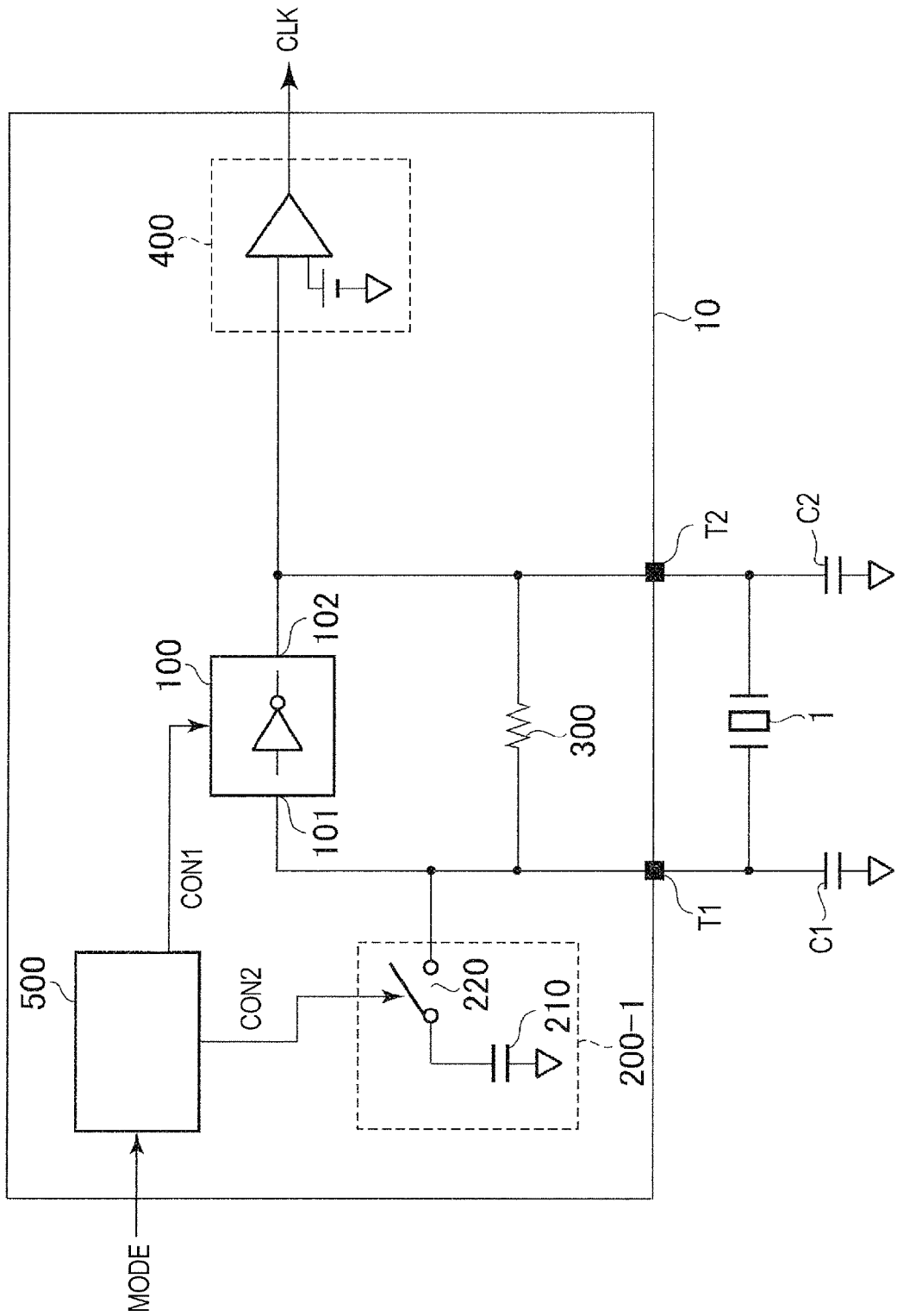
FIG. 9 is a circuit diagram depicting a modification of the oscillator circuit according to the embodiment of the present invention.

As shown in FIG. 9, for example, only the first variable capacitor 200-1 is provided and the second variable capacitor 200-2 may be omitted. In this case, as compared with the case of FIG. 1, the area of the oscillator circuit 10 is reduced.

Figure 10:
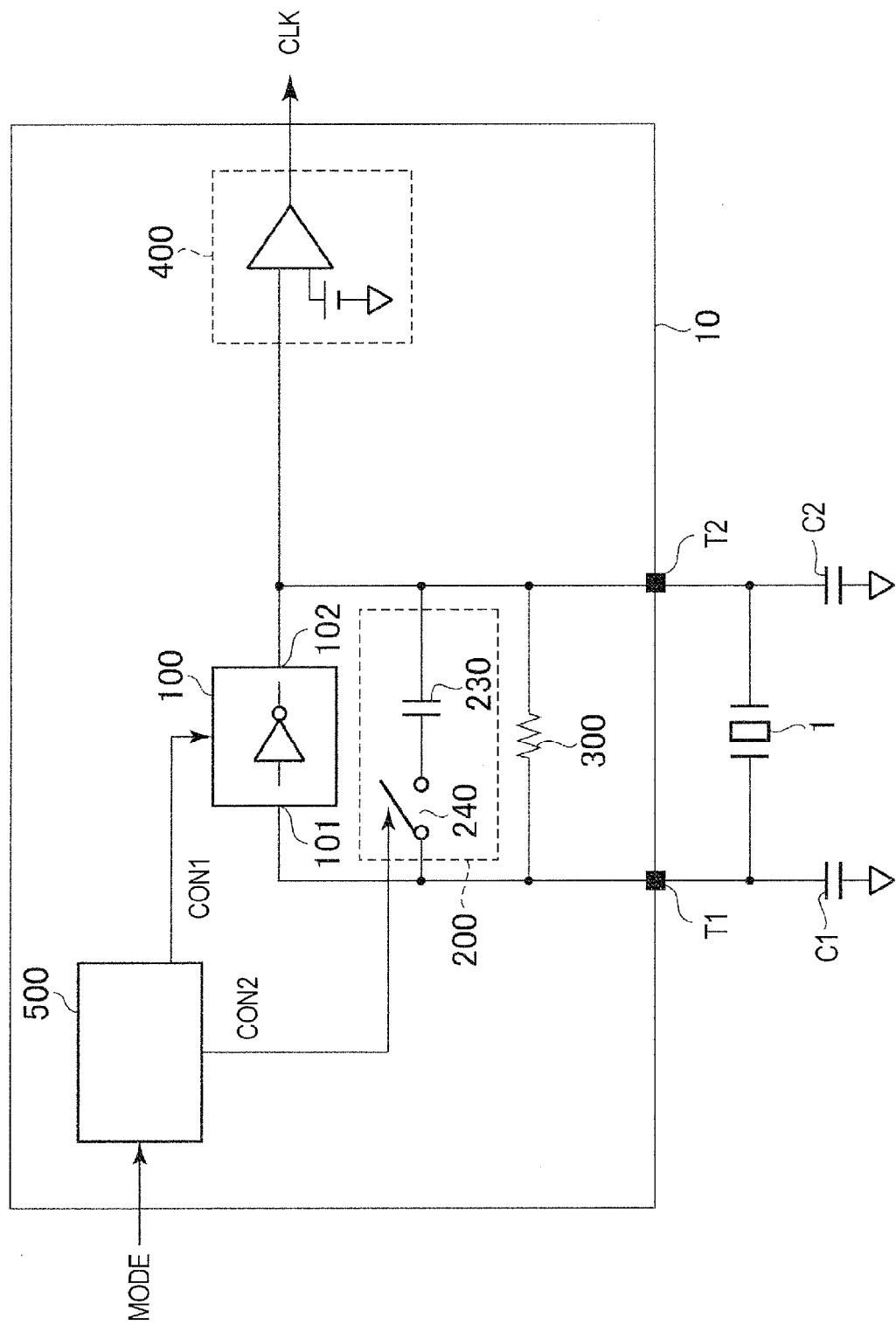
FIG. 10 is a circuit diagram showing another modification of the oscillator circuit according to the embodiment of the present invention.

As shown in FIG. 10, one variable capacitor 200 may be provided to couple between a first terminal T1 and a second terminal T2. Such a coupling configuration is preferred in that a "mirror effect" that the apparent capacity increases is expected. Since the number of the variable capacitors 200 is reduced, an area reducing effect is also obtained. Incidentally, the capacitance value of the variable capacitor 200 can be controlled by a second control signal CON2. For example, the variable capacitor 200 is provided with a capacitor 230 and a switch 240 coupled in series between the first terminal T1 and the second terminal T2. A capacitance value coupled to each of the first terminal T1 and the second terminal T2 can be switched by ON/OFF-controlling the switch 240 by the second control signal CON2.

Figure 11:
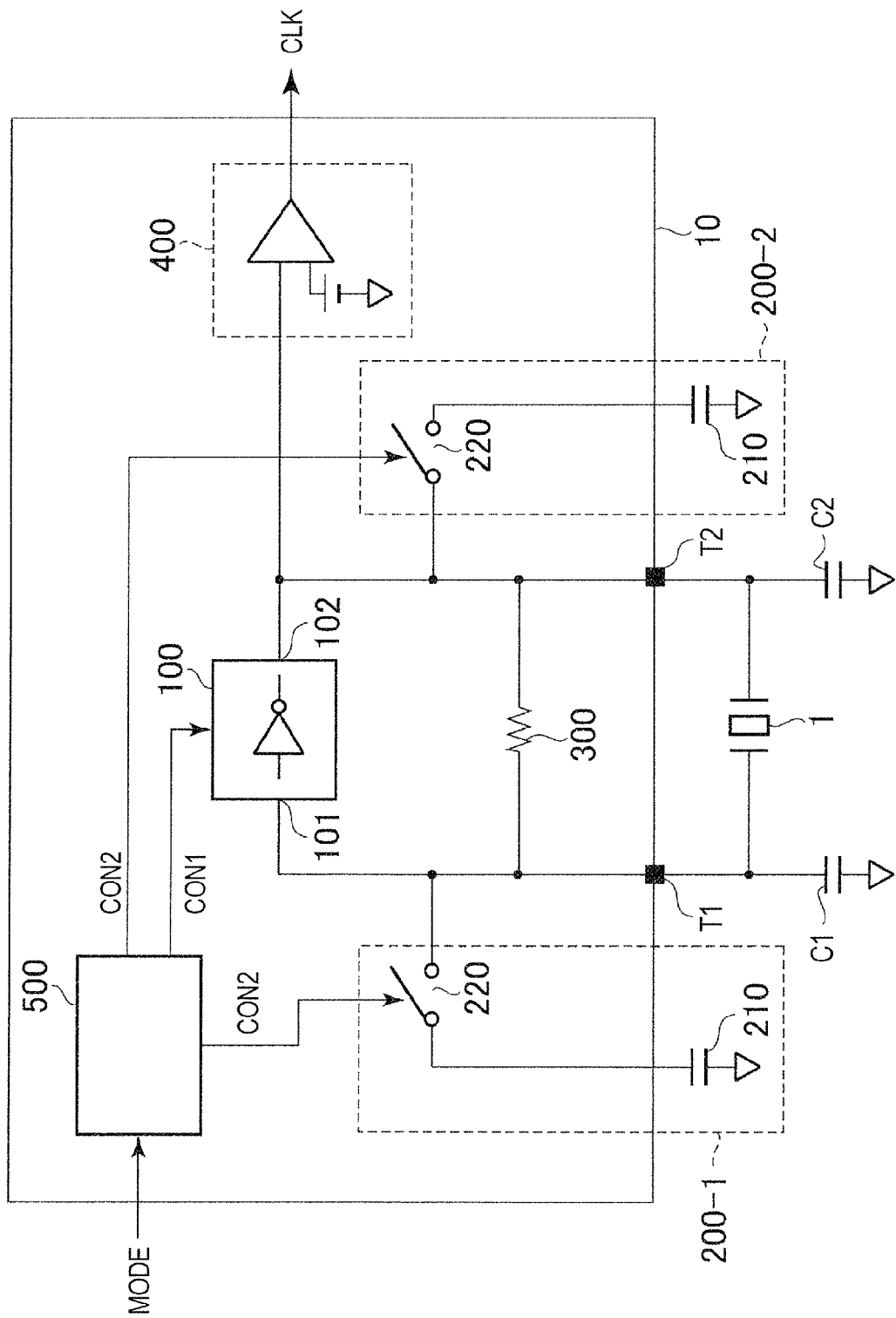
FIG. 11 is a circuit diagram illustrating a further modification of the oscillator circuit according to the embodiment of the present invention.

As shown in FIG. 11, a capacitor 210 in each variable capacitor 200 may be provided outside a semiconductor chip as with a first capacitor C1 and a second capacitor C2. It is thus possible to suppress an increase in chip area.

2. Application Example of Oscillator Circuit 2-1. Semiconductor Device

Figure 12:
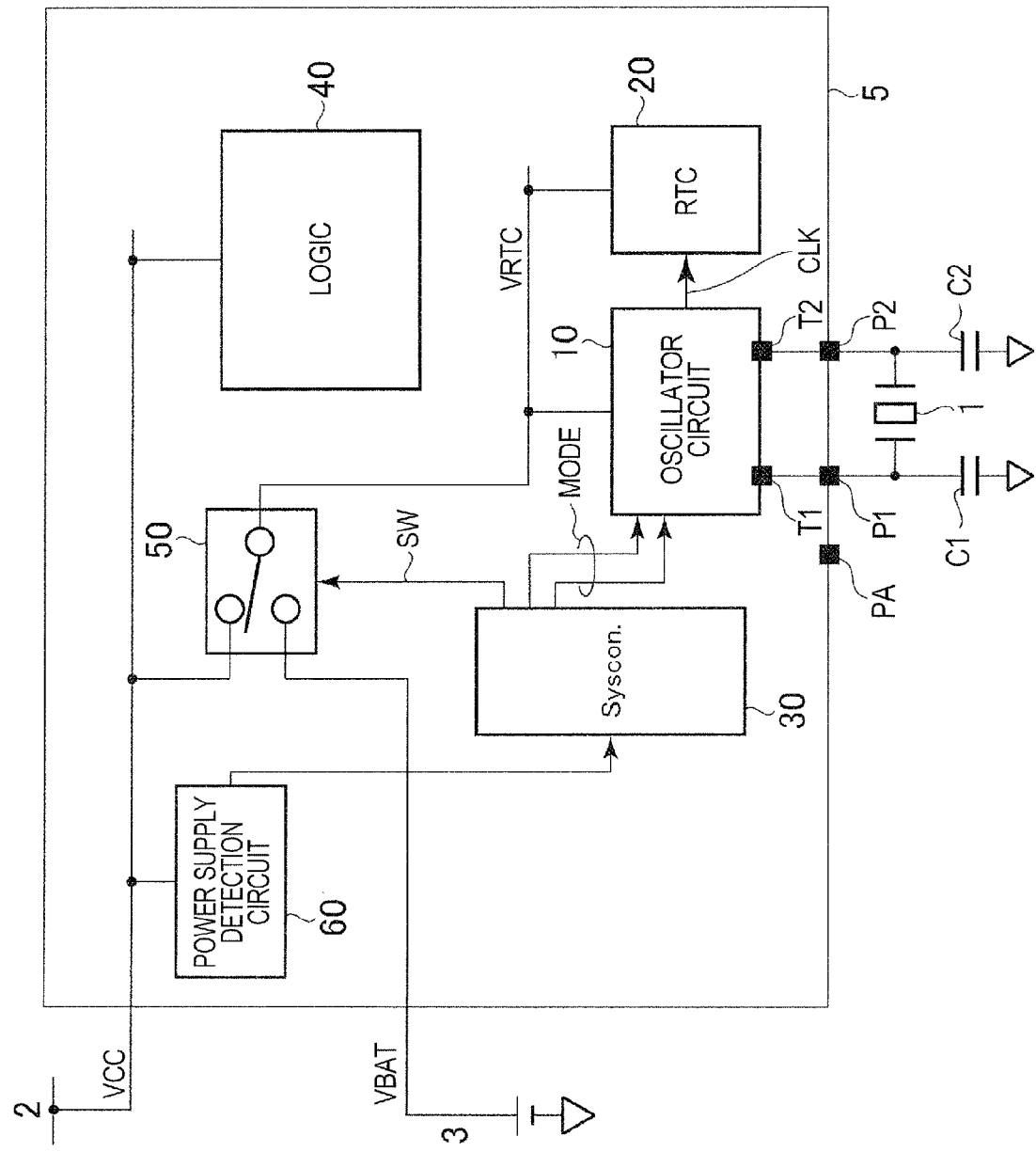
FIG. 12 a block diagram showing a configuration example of a semiconductor device according to an embodiment of the present invention.

FIG. 12 shows a configuration example of a semiconductor device (semiconductor chip 5) to which the oscillator circuit 10 according to the present embodiment is applied. The semiconductor chip 5 is coupled to a power supply 2 and supplied with a power supply voltage VCC (normal power supply voltage) from the power supply 2. The semiconductor chip 5 is coupled to a battery 3 used as a backup power supply and supplied with a battery power supply voltage VBAT (backup power supply voltage) from the battery 3.

The semiconductor chip 5 is provided with the above oscillator circuit 10, an RTC (Real Time Clock) circuit 20, a system controller 30, a logic circuit 40, a power supply switching circuit 50 and a power supply detection circuit 60.

The first and second terminals T1 and T2 of the oscillator circuit 10 are respectively coupled to first and second pins P1 and P2 of the semiconductor chip 5. The first pin P1 and the second pin P2 are coupled to a crystal resonator 1 and the like that are external parts. Specifically, the first pin P1 and the second pin P2 are coupled to both ends of the crystal resonator 1. The first pin P1 is coupled to a first capacitor C1, and the second pin P2 is coupled to a second capacitor C2. As mentioned above, the oscillator circuit 10 generates and outputs a clock signal CLK.

The RTC circuit 20 receives the clock signal CLK generated by the oscillator circuit 10 therein and operates based on the clock signal CLK.

The system controller 30 controls the entire operation of the semiconductor chip 5. For example, the system controller 30 generates the above mode signal MODE in response to the operating mode of the semiconductor chip 5 and outputs the mode signal MODE to the oscillator circuit 10. Thus, the oscillator circuit 10 performs an operation corresponding to the mode signal MODE.

The logic circuit 40 operates based on the power supply voltage VCC and provides a prescribed function.

Since the oscillator circuit 10 and the RTC circuit 20 are used in a timer, they are required to always operate. Thus, when the power supply voltage VCC is lowered, for example, the battery power supply voltage VBAT is supplied to the oscillator circuit 10 and the RTC circuit 20 instead of the power supply voltage VCC. That is, the power supply voltage (hereinafter referred to as "RTC power supply voltage VRTC") supplied to the oscillator circuit 10 and the RTC circuit 20 can be switched between the power supply voltage VCC and the battery power supply voltage VBAT according to the circumstances. The power supply switching circuit 50 and the power supply detection circuit 60 are provided to perform automatic switching of such an RTC power supply voltage VRTC.

The power supply switching circuit 50 receives the power supply voltage VCC and the battery power supply voltage VBAT and supplies either of them to the oscillator circuit 10 and the RTC circuit 20 as the RTC power supply voltage VRTC. The RTC power supply voltage VRTC is specified by a power supply switch signal SW. That is, the power supply switching circuit 50 switches the RTC power supply voltage VRTC between the power supply voltage VCC and the battery power supply voltage VBAT in response to the power supply switch signal SW.

The power supply detection circuit 60 monitors the power supply voltage VCC. When the power supply voltage VCC reaches a prescribed threshold value or less, the power supply detection circuit 60 outputs a power supply reduction signal to the system controller 30. In response to the power supply reduction signal, the system controller 30 outputs the power supply switch signal SW to the power supply switching circuit 50 and thereby controls power supply switching. Specifically, the system controller 30 controls the power supply switching circuit 50 in such a manner that the RTC power supply voltage VRTC is switched from the power supply voltage VCC to the battery power supply voltage VBAT.

On the other hand, when the power supply voltage VCC reaches the prescribed threshold value or more, the power supply detection circuit 60 outputs a power supply recovery signal to the system controller 30. In response to the power supply recovery signal, the system controller 30 outputs the power supply switch signal SW to the power supply switching circuit 50 and thereby controls power supply switching. Specifically, the system controller 30 controls the power supply switching circuit 50 in such a manner that the RTC power supply voltage VRTC is switched from the battery power supply voltage VBAT to the power supply voltage VCC.

2-2. Emulation Using Adjacent Pins

The oscillator circuit 10 is a circuit that performs weak oscillations with small current. There is therefore a possibility that a signal inputted to a pin PA (refer to FIG. 12) adjacent to the first pin P1 coupled to the oscillator circuit 10 and the crystal resonator 1 will exert an influence on the operation of the oscillator circuit 10. It is thus desirable that the adjacent pin PA is such a pin as not to be used in a final product. For example, it is desirable that the adjacent pin PA is a pin used in a "debug mode" that performs emulation of the semiconductor chip 5.

Figure 13:
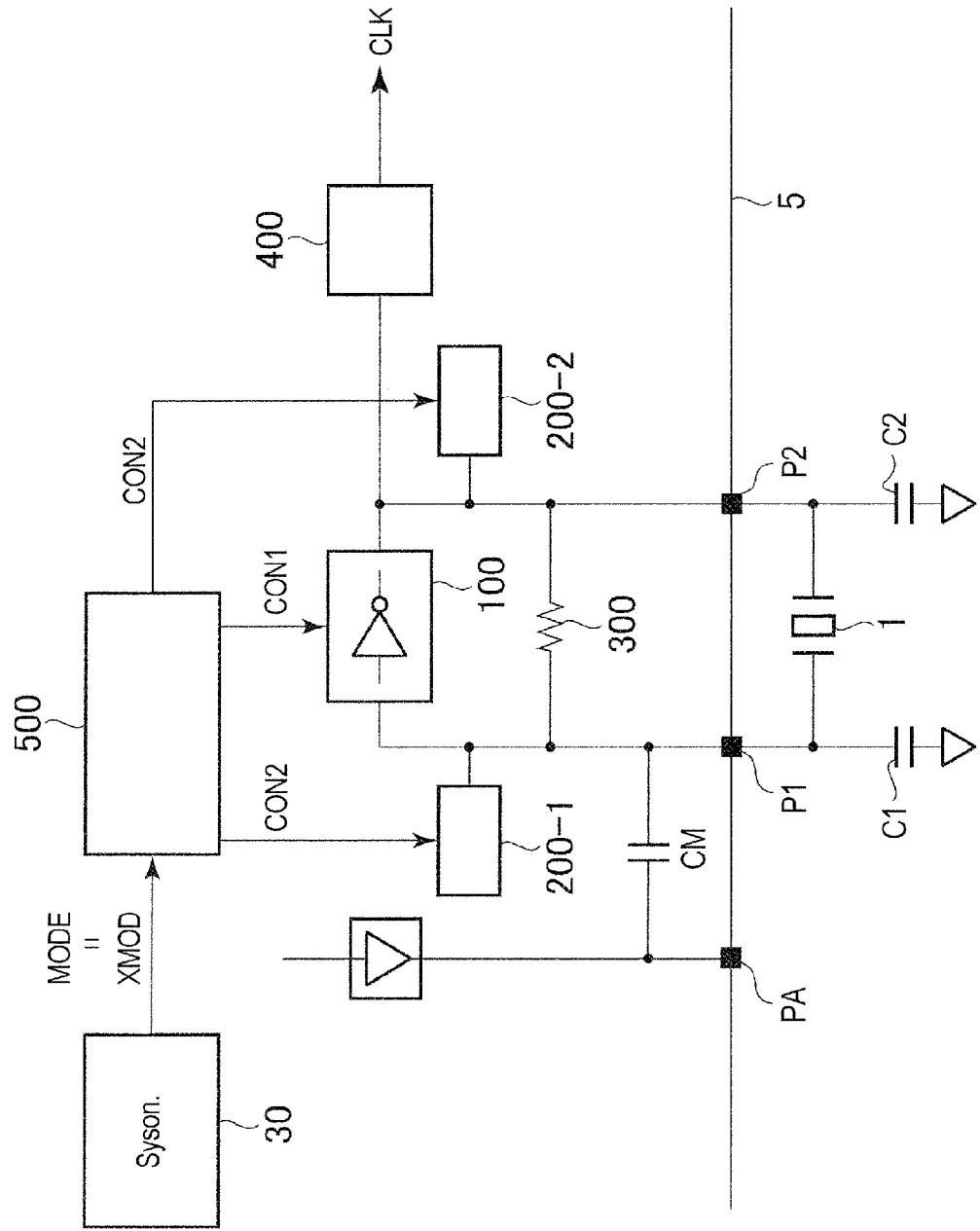
FIG. 13 is a circuit diagram for describing an application example of the oscillator circuit according to the embodiment of the present invention.

FIG. 13 shows a state in the debug mode. The adjacent pin PA is coupled to an external emulator (not shown). A debug is performed through the adjacent pin PA by using the emulator. At this time, as shown in FIG. 13, coupling occurs between a wiring coupled to the adjacent pin PA and the oscillator circuit 10. Accordingly, the malfunction (clock reduction or losing or the like) of the oscillator circuit 10 might occur due to noise of the adjacent pin PA in the debug mode.

The oscillator circuit 10 according to the present embodiment is effective against such noise of the adjacent pin PA in the debug mode. That is, the second mode that is of the high noise-immunity mode may preferably be associated with the debug mode that performs emulation. On the other hand, the first mode that is of the low power mode is a mode in which no emulation is conducted. A mode signal MODE indicative of whether it is the debug mode is hereinafter referred to as a "debug mode signal XMOD". The debug mode signal XMOD is supplied from the system controller 30 to the oscillator circuit 10. That is, the switching of the operating mode is automatically controlled by the system controller 30.

Figure 14:
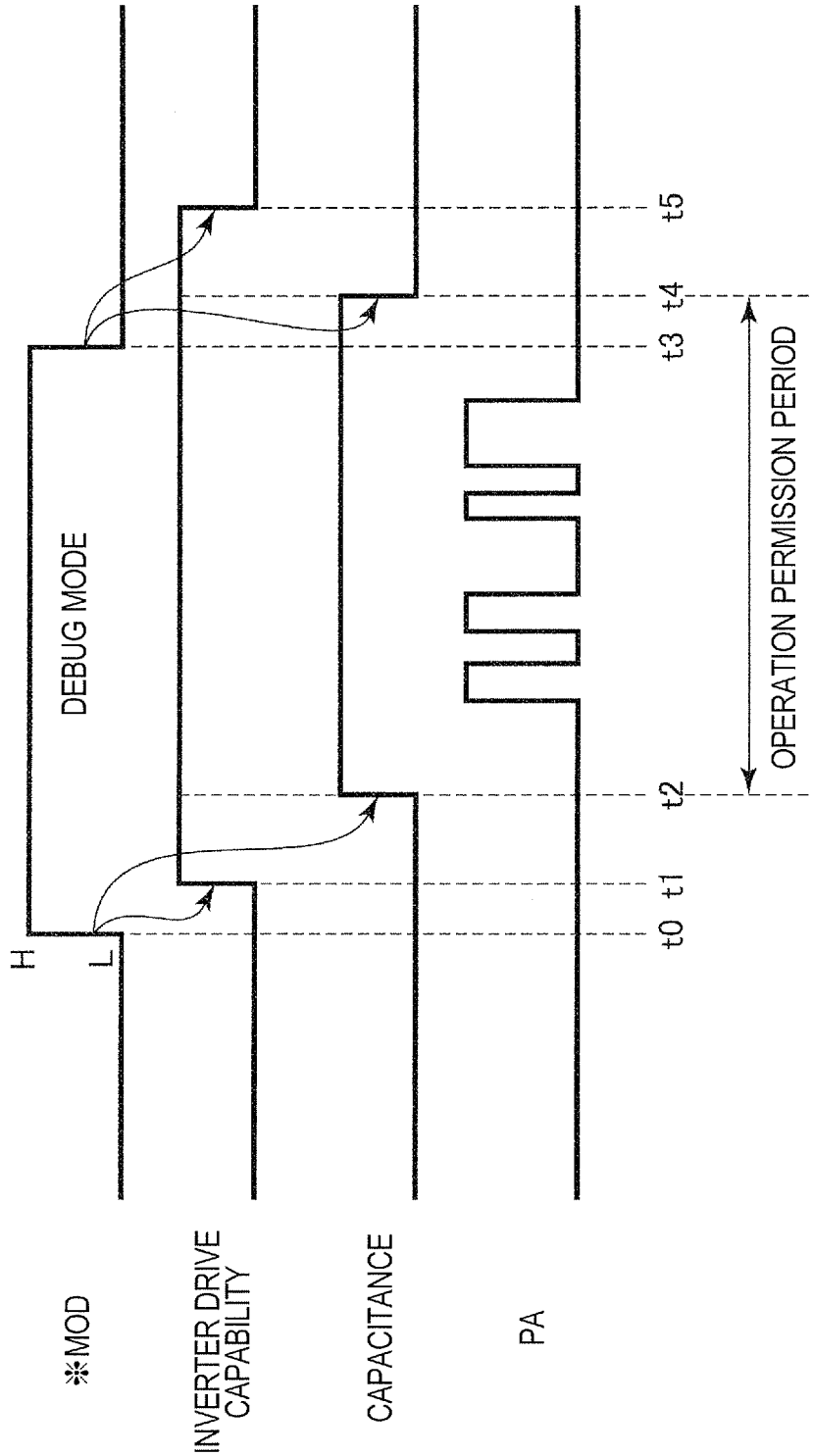
FIG. 14 is a timing chart for describing the application example of the oscillator circuit according to the embodiment of the present invention.

FIG. 14 is a timing chart showing a method for controlling the oscillator circuit 10 according to the present embodiment. In the present embodiment, a debug mode signal XMOD of a Low level is assumed to indicate a first mode, and a debug mode signal XMOD of a High level is assumed to indicate a second mode (debug mode).

At a time t0, the debug mode signal XMOD is changed from the Low level to the High level. Thus, the operating mode is switched from the first mode to the second mode (debug mode). In this case, the control circuit 500 performs control to increase "both" of the drive capability of the inverter circuit 100 and the capacitance value of each variable capacitor 200. Specifically, the control circuit 500 increases the drive capability of the inverter circuit 100 at a time t1 subsequent to the time t0 and further increases the capacitance value of the variable capacitor 200 at a time t2 after the time t1.

Thus, since the drive current and load capacity of the oscillator circuit 10 increase, the influence of coupling to the adjacent pin PA becomes small. For example, when the value of the capacitance coupled to the first terminal T1 increases from 3 pF to 12 pF, the influence of coupling to the adjacent pin PA is reduced approximately to ¼. As a result, the malfunction of the oscillator circuit 10 due to the noise of the adjacent pin PA is effectively suppressed. After the time t2, emulation using the adjacent pin PA is permitted.

After the end of the emulation, the debug mode signal XMOD is changed from the High level to the Low level at a time t3. Thus, the operating mode is switched from the second mode (debug mode) to the first mode. In this case, the control circuit 500 performs control to decrease "both" of the drive capability of the inverter circuit 100 and the capacitance value of each variable capacitor 200. Specifically, the control circuit 500 decreases the capacitance value of the variable capacitor 200 at a time t4 subsequent to the time t3 and further decreases the drive capability of the inverter circuit 100 at a time t5 subsequent to the time t4. Thus, power consumption is reduced.

Incidentally, since the adjacent pin PA used in the emulation adjoins the first pin P1, only the first variable capacitor 200-1 on the first pin P1 side close to a noise source may be provided (refer to FIG. 9). Even in this case, significant high noise immunity is obtained. The effect of reducing an area is obtained by omitting the second variable capacitor 200-2 on the second pin P2 side.

2-3. Switching of Power Supply Voltage

Figure 15:
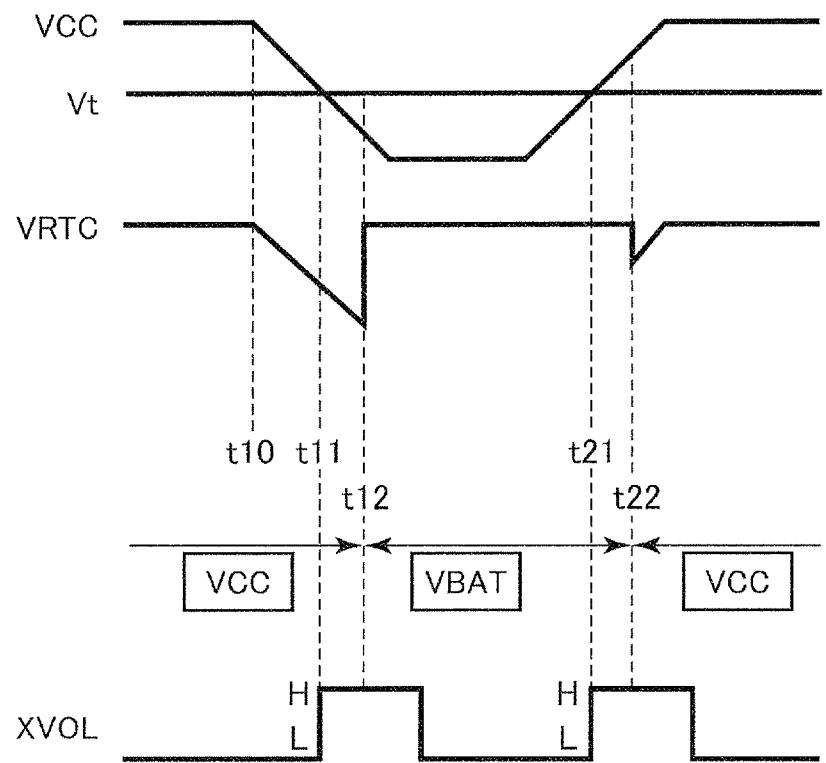
FIG. 15 is a conceptual diagram for describing another application example of the oscillator circuit according to the embodiment of the present invention.

As mentioned above, the switching of the RTC power supply voltage VRTC is automatically performed by the power supply switching circuit 50, the power supply detection circuit 60 and the system controller 30 (refer to FIG. 12). The switching of the RTC power supply voltage VRTC will be described in more detail referring to FIG. 15.

First, the RTC power supply voltage VRTC is of a power supply voltage VCC. At a time t10, the power supply voltage VCC begins to drop. At a time t11, the power supply voltage VCC falls below a predetermined threshold value Vt. In response to it, the system controller 30 outputs a power supply switch signal SW to the power supply switching circuit 50 and thereby changes the RTC power supply voltage VRTC from the power supply voltage VCC to a battery power supply voltage VBAT. Since, however, a response delay actually occurs, the RTC power supply voltage VRTC is changed from the power supply voltage VCC to the battery power supply voltage VBAT at a time t12 subsequent to the time t11.

After the time t12, the RTC power supply voltage VRTC is of the battery power supply voltage VBAT. Thereafter, the power supply voltage VCC begins to rise. At a time t21, the power supply voltage VCC exceeds the predetermined threshold value Vt. In response to it, the system controller 30 outputs the power supply switch signal SW to the power supply switching circuit 50 and thereby changes the RTC power supply voltage VRTC from the battery power supply voltage VBAT to the power supply voltage VCC. Since, however, a response delay actually occurs, the RTC power supply voltage VRTC is changed from the battery power supply voltage VBAT to the power supply voltage VCC at a time t22 subsequent to the time t21.

Thus, the RTC power supply voltage VRTC is reduced from the level of the power supply voltage VCC for a while upon power supply switching. Particularly during the period from the times t10 to t12 in which the power supply voltage VCC is reduced, the RTC power supply voltage VRTC is also greatly reduced. These lead to the malfunction (clock reduction or the like) of the oscillator circuit 10.

The oscillator circuit 10 according to the present embodiment is effective against the voltage reduction at such switching of the RTC power supply voltage VRTC. That is, the second mode that is of the high noise-immunity mode may preferably be associated with a mode that "permits" the switching of the RTC power supply voltage VRTC. On the other hand, the first mode that is of the low power mode is associated with a mode that "prohibits" the switching of the RTC power supply voltage VRTC. The mode signal MODE indicative of the permission/prohibition of switching is hereinafter referred to as a "power-supply switch permission signal XVOL". The power-supply switch permission signal XVOL is supplied from the system controller 30 to the oscillator circuit 10. That is, the switching of the operating mode is automatically controlled by the system controller 30.

Figure 16:
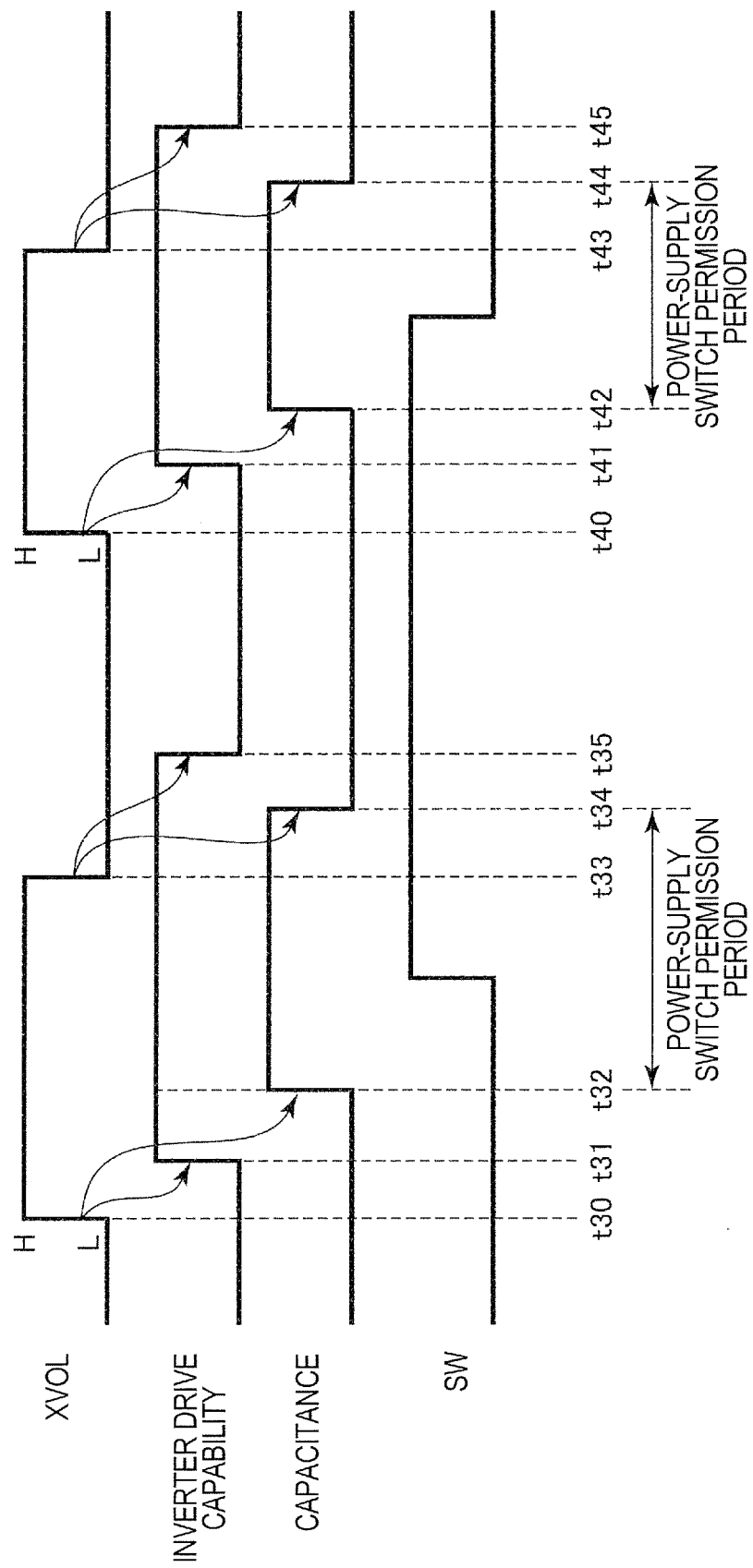
FIG. 16 is a timing chart for describing another application example of the oscillator circuit according to the embodiment of the present invention.

FIG. 16 is a timing chart showing the control method of the oscillator circuit 10 according to the present embodiment. In the present embodiment, a power-supply switch permission signal XVOL of a Low level is assumed to show the first mode (switching prohibition). A power-supply switch permission signal XVOL of a High level is assumed to show the second mode (switching permission).

Control at the switching of the RTC power supply voltage VRTC from the power supply voltage VCC to the battery power supply voltage VBAT is as follows:

At a time t30, the power-supply switch permission signal XVOL is switched from a Low level to a High level. Thus, the operating mode is switched from the first mode to the second mode. In this case, the control circuit 500 performs control to increase "both" of the drive capability of the inverter circuit 100 and the capacitance value of each variable capacitor 200. Specifically, the control circuit 500 increases the drive capability of the inverter circuit 100 at a time t31 subsequent to the time t30. Further, the control circuit 500 increases the capacitance value of the variable capacitor 200 at a time t32 subsequent to the time t31. As a result, an influence exerted on the operation of the oscillator circuit 10 due to a reduction in the RTC power supply voltage VRTC becomes small.

At a time t33, the power-supply switch permission signal XVOL is switched from the High level to the Low level. Thus, the operating mode is switched from the second mode to the first mode. In this case, the control circuit 500 performs control to decrease "both" of the drive capability of the inverter circuit 100 and the capacitance value of each variable capacitor 200. Specifically, the control circuit 500 decreases the capacitance value of the variable capacitor 200 at a time t34 subsequent to the time t33. Further, the control circuit 500 decreases the drive capability of the inverter circuit 100 at a time t35 subsequent to the time t34. Thus, power consumption is reduced.

Here, the period from the times t32 to t34 is a power-supply switch permission period during which the switching of the RTC power supply voltage VRTC is permitted. Thus, the system controller 30 performs switching of the power supply switch signal SW in such a manner that the RTC power supply voltage VRTC is switched during the power-supply switch permission period. In other words, the system controller 30 switches the power-supply switch permission signal XVOL from the Low level to the High level prior to the switching of the power supply switch signal SW. After the switching of the power supply switch signal SW, the system controller 30 switches the power-supply switch permission signal XVOL from the High level to the Low level.

Control at the switching of the RTC power supply voltage VRTC from the battery power supply voltage VBAT to the power supply voltage VCC is as follows:

At a time t40, the power-supply switch permission signal XVOL is switched from the Low level to the High level. Thus, the operating mode is switched from the first mode to the second mode. In this case, the control circuit 500 performs control to increase "both" of the drive capability of the inverter circuit 100 and the capacitance value of each variable capacitor 200. Specifically, the control circuit 500 increases the drive capability of the inverter circuit 100 at a time t41 subsequent to the time t40. Further, the control circuit 500 increases the capacitance value of the variable capacitor 200 at a time t42 subsequent to the time t41. As a result, an influence exerted on the operation of the oscillator circuit 10 due to a reduction in the RTC power supply voltage VRTC becomes small.

At a time t43, the power-supply switch permission signal XVOL is switched from the High level to the Low level. Thus, the operating mode is switched from the second mode to the first mode. In this case, the control circuit 500 performs control to decrease "both" of the drive capability of the inverter circuit 100 and the capacitance value of each variable capacitor 200. Specifically, the control circuit 500 decreases the capacitance value of the variable capacitor 200 at a time t44 subsequent to the time t43. Further, the control circuit 500 decreases the drive capability of the inverter circuit 100 at a time t45 subsequent to the time t44. Thus, power consumption is reduced.

Here, the period from the times t42 to t44 is a power-supply switch permission period during which the switching of the RTC power supply voltage VRTC is permitted. Thus, the system controller 30 performs switching of the power supply switch signal SW in such a manner that the RTC power supply voltage VRTC is switched during the power-supply switch permission period. In other words, the system controller 30 switches the power-supply switch permission signal XVOL from the Low level to the High level prior to the switching of the power supply switch signal SW. After the switching of the power supply switch signal SW, the system controller 30 switches the power-supply switch permission signal XVOL from the High level to the Low level.

The drive current and load capacity of the oscillator circuit 10 increases during the power-supply switch permission period in this manner. Thus, the switching of the RTC power supply voltage VRTC during the power-supply switch permission period enables an influence exerted on the operation of the oscillator circuit 10 by its switching to be minimized.

2-4. Other Application Examples

For example, consider where the semiconductor chip 5 includes a function block easy to generate noise. The operating mode of the oscillator circuit 10 may preferably be set to the second mode at the start and stop of the operation of the function block. It is thus possible to minimize an influence exerted on the operation of the oscillator circuit 10 due to the noise from the function block.

3. Regarding Comparator Circuit

A description will hereinafter be made of various configuration examples of a comparator circuit 400 for improving noise immunity.

Figure 17:
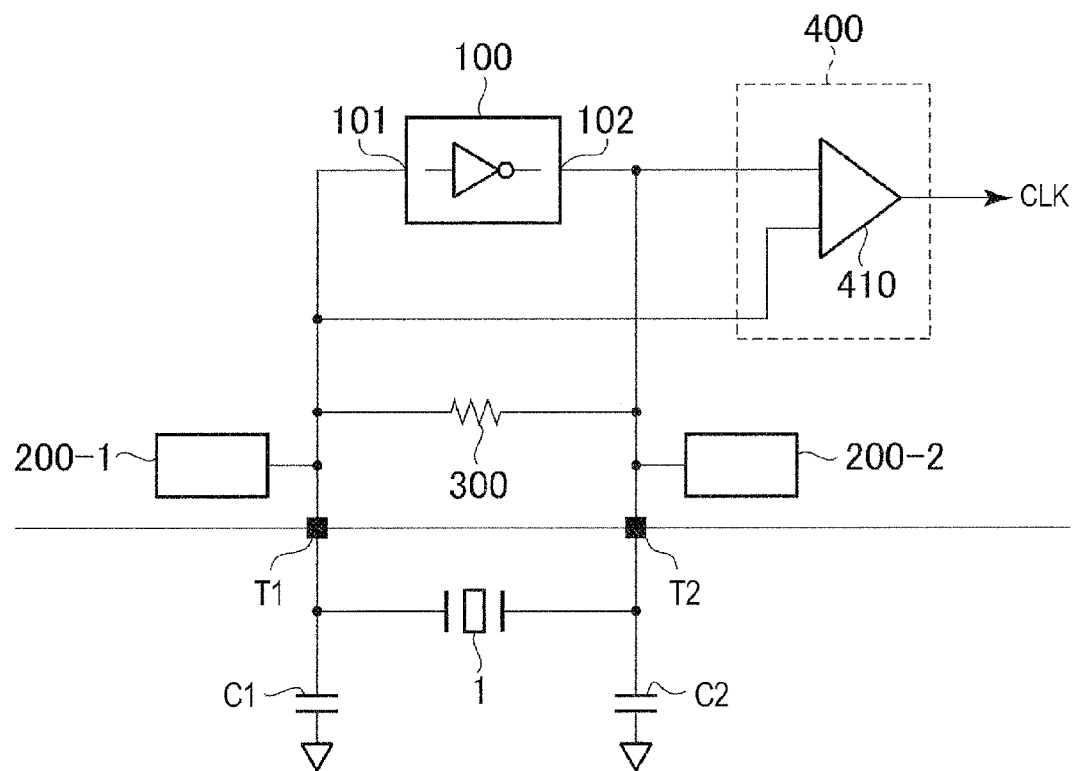
FIG. 17 is a circuit diagram showing a modification of a comparator circuit in the oscillator circuit according to the embodiment of the present invention.

In the example shown in FIG. 17, the comparator circuit 400 is provided with a differential comparator 410. Two inputs of the comparator 410 are coupled to their corresponding first and terminals T1 and T2. In this case, since the comparator 410 performs a differential operation, an output is obtained if a difference in potential occurs even slightly between the first and second terminals T1 and T2. When inphase noise are applied to the first and second terminals T1 and T2, they are cancelled and do not affect a clock signal CLK. The comparator circuit 400 of the present example is particularly effective in switching of the power supply voltage (refer to the section 2-3).

Figure 18:
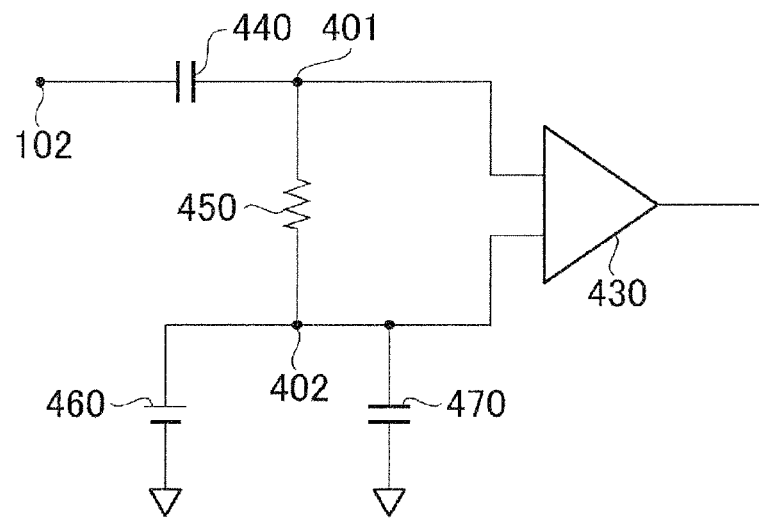
FIG. 18 is a circuit diagram illustrating another modification of the comparator circuit in the oscillator circuit according to the embodiment of the present invention.

FIG. 18 shows a capacitively-coupled comparator circuit 400. More specifically, the comparator circuit 400 is provided with a comparator 430, a capacitor 440, a resistor 450, a reference voltage power supply 460 and a capacitor 470. Two inputs of the comparator 430 are respectively coupled to a node 401 and a node 402. The capacitor 440 is coupled between the node 401 and an output terminal 102 of an inverter circuit 100. The resistor 450 is coupled between the node 401 and the node 402. The reference voltage power supply 460 is coupled to the node 402 and supplies a reference voltage to the node 402. The capacitor 470 is coupled between the node 402 and a ground terminal. Even when a DC operating point (center voltage of oscillation) shifts for some reason, an output is obtained by capacitive coupling of the input of the comparator 430 without problems.

Figure 19:
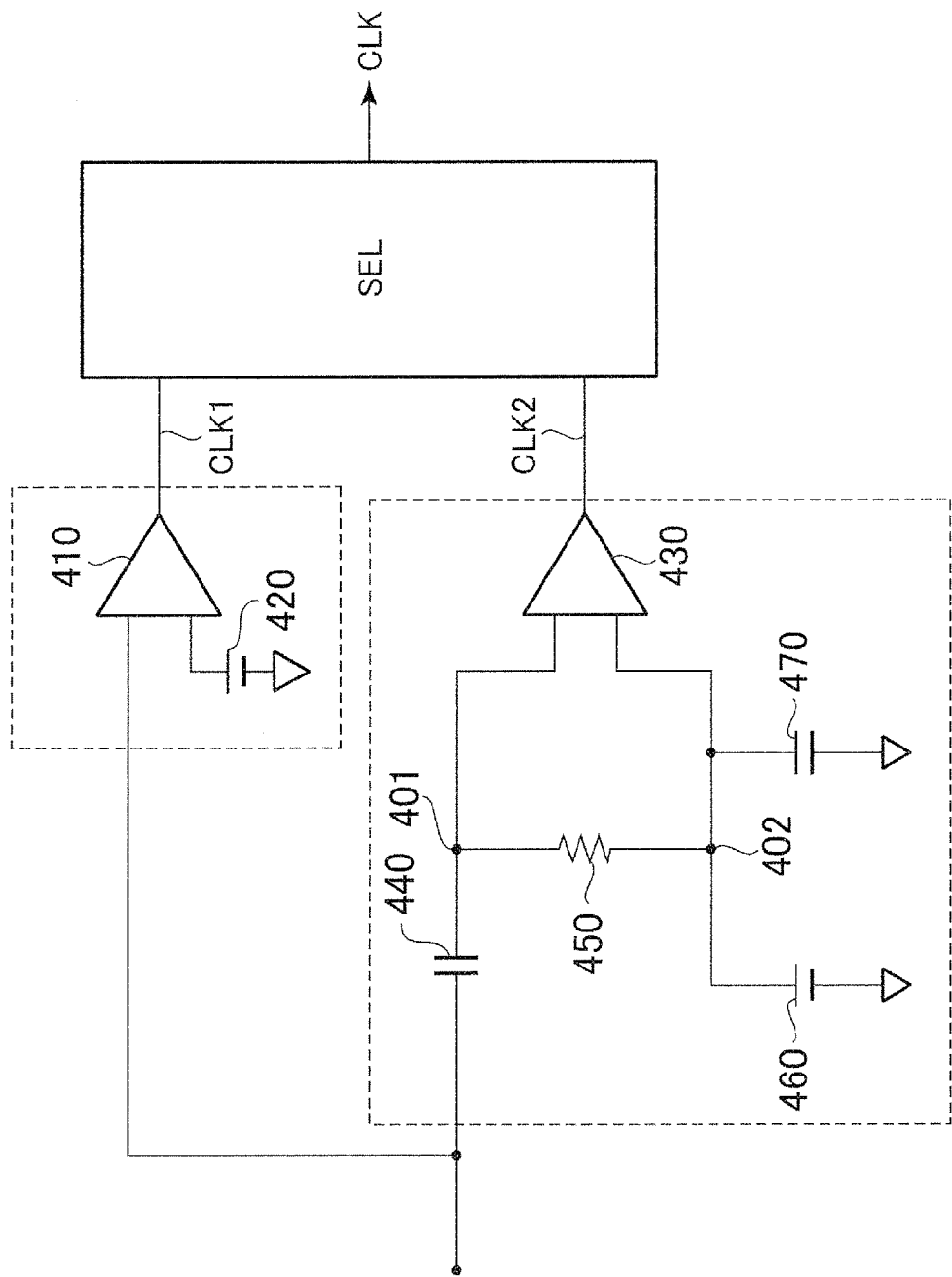
FIG. 19 is a circuit diagram depicting a further modification of the comparator circuit in the oscillator circuit according to the embodiment of the present invention.

FIG. 19 shows a hybrid comparator circuit 400. More specifically, both of the comparator circuit 400 shown in FIG. 1 and the comparator circuit 400 shown in FIG. 18 are provided. The comparator circuit 400 shown in FIG. 1 generates a first clock signal CLK1. On the other hand, the comparator circuit 400 shown in FIG. 18 generates a second clock signal CLK2. A selection circuit 480 receives the first clock signal CLK1 and the second clock signal CLK2 and outputs one of them as a clock signal CLK. It is preferred in that the proper one of the first and second clock signals CLK1 and CLK2 can selectively be used according to the operating mode.

4. Regarding Power Supply Line

Figure 20:
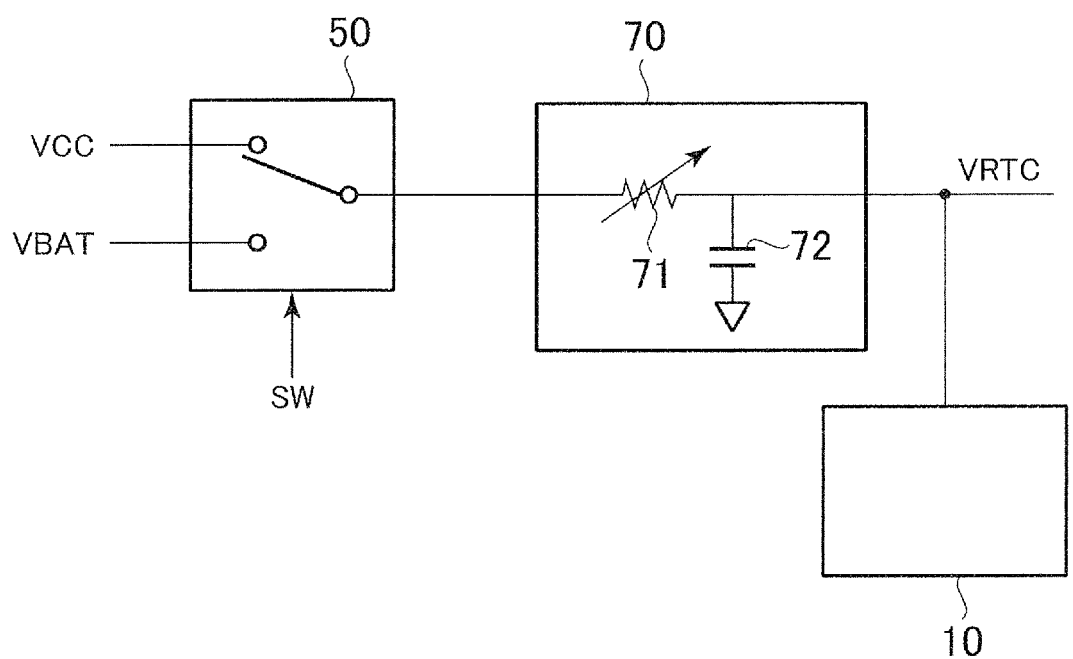
FIG. 20 is a block diagram showing a modification of the semiconductor device according to the embodiment of the present invention.

FIG. 20 shows another configuration example for improving noise immunity relative to power supply switching. In the example shown in FIG. 20, a low-pass filter 70 is provided on a power supply line for supplying an RTC power supply voltage VRTC to an oscillator circuit 10. The low-pass filter 70 is provided with a variable resistor 71 and a capacitor 72.

Upon switching of the RTC power supply voltage VRTC, the resistance value of the variable resistor 71 in the low-pass filter 70 is changed in response to a power-supply switch permission signal XVOL. Specifically, the resistance value of the variable resistor 71 in the low-pass filter 70 increases during the above power-supply switch permission period. Thus, the slope of a fluctuation in the RTC power supply voltage VRTC becomes gentle, so that the occurrence of a malfunction of the oscillator circuit 10 is suppressed.

Incidentally, the above examples can also be combined with one another in a consistent range.

While the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device comprising:
   first and second terminals respectively coupled to both ends of a crystal resonator;
   an inverter circuit having an input coupled to the first terminal and an output coupled to the second terminal;
   a feedback resistor which couples between the first terminal and the second terminal;
   a variable capacitor coupled to at least one of the first and second terminals; and
   a control circuit which controls a drive capability of the inverter circuit and a capacitance value of the variable capacitor, based on a mode signal which specifies each of first and second modes,
   wherein the control circuit performs control to increase both of the drive capability of the inverter circuit and the capacitance value of the variable capacitor in the second mode rather than the first mode,
   wherein upon switching from the first mode to the second mode, the control circuit increases the capacitance value of the capacitor after having increased the drive capability of the inverter circuit, and
   wherein upon switching from the second mode to the first mode, the control circuit decreases the drive capability of the inverter circuit after having decreased the capacitance value of the variable capacitor.

2. The semiconductor device according to claim 1, further including:
   a comparator circuit which is coupled to the second terminal and generates a clock signal from a voltage of the second terminal; and
   a frequency dividing circuit which performs a frequency division of the clock signal outputted from the comparator circuit,
   wherein the control circuit changes a frequency dividing ratio of the frequency dividing circuit in response to the mode signal in such a manner that the frequency of the clock signal becomes identical between the first mode and the second mode.

3. The semiconductor device according to claim 1,
   wherein the second mode is a mode which permits switching of a power supply voltage of the semiconductor device, and
   wherein the first mode is a mode which prohibits switching of the power supply voltage.

4. The semiconductor device according to claim 3, including:
   an oscillator circuit having the first terminal, the second terminal, the inverter circuit, the feedback resistor, the variable capacitor and the control circuit;
   a clock circuit which operates based on a clock signal generated by the oscillator circuit;
   a power supply switching circuit which switches the power supply voltage supplied to the oscillator circuit and the clock circuit between a normal power supply voltage and a backup power supply voltage; and
   a controller which controls the power supply switching circuit in such a manner that when the normal power supply voltage reaches a predetermined threshold value or less, the power supply voltage is switched from the normal power supply voltage to the backup power supply voltage and that when the normal power supply voltage reaches the predetermined threshold value or more, the power supply voltage is switched from the backup power supply voltage to the normal power supply voltage, wherein the controller generates the mode signal, based on the switching of the power supply voltage and outputs the mode signal to the control circuit.

5. The semiconductor device according to claim 4, wherein the controller controls the mode signal in such a manner that a mode is switched to the second mode prior to the switching of the power supply voltage and that the mode is switched to the first mode after the end of the switching of the power supply voltage.

6. The semiconductor device according to claim 1,
wherein the inverter circuit includes:
a transistor having a gate coupled to the first terminal, a drain coupled to the second terminal and a source coupled to a ground terminal; and
a variable current source which supplies a current to the second terminal, and
wherein the control circuit controls a current supply capacity of the variable current source in response to the mode signal to thereby control the drive capability of the inverter circuit.

7. The semiconductor device according to claim 1, wherein the variable capacitor is coupled between the first terminal and the second terminal.

8. A semiconductor device comprising:
first and second terminals respectively coupled to both ends of a crystal resonator;
an inverter circuit having an input coupled to the first terminal and an output coupled to the second terminal;
a feedback resistor which couples between the first terminal and the second terminal;
a variable capacitor coupled to at least one of the first and second terminals; and
a control circuit which controls a drive capability of the inverter circuit and a capacitance value of the variable capacitor, based on a mode signal which specifies each of first and second modes,
wherein the control circuit performs control to increase both of the drive capability of the inverter circuit and the capacitance value of the variable capacitor in the second mode rather than the first mode,
wherein the second mode is a debug mode which performs emulation of the semiconductor device, and
wherein the first mode is a mode which does not perform the emulation.

9. The semiconductor device according to claim 8, wherein a pin used in the emulation is adjacent to a pin coupled to the crystal resonator.

10. The semiconductor device according to claim 9,
wherein the variable capacitor is coupled only to one of the first and second terminals, and
wherein the pin used in the emulation is closer to the one of the first and second terminals than the other of the first and second terminals.

11. A control method of a semiconductor device comprising:
first and second terminals respectively coupled to both ends of a crystal resonator;
an inverter circuit having an input coupled to the first terminal and an output coupled to the second terminal;
a feedback resistor which couples between the first terminal and the second terminal; and
a variable capacitor coupled to at least one of the first and second terminals,
the control method comprising the steps of:
switching an operating mode between a first mode and a second mode; and
performing control in such a manner that both of a drive capability of the inverter circuit and a capacitance value of the variable capacitor become larger in the second mode than in the first mode,
wherein the control performing step includes the steps of:
increasing, upon switching from the first mode to the second mode, the capacitance value of the variable capacitor after having increased the drive capability of the inverter circuit; and
decreasing, upon switching from the second mode to the first mode, the drive capability of the inverter circuit after having decreased the capacitance value of the variable capacitor.

12. The control method according to claim 11,
wherein the second mode is a debug mode which performs emulation of the semiconductor device, and
wherein the first mode is a mode which does not perform the emulation.

13. The control method according to claim 11,
wherein the second mode is a mode which permits switching of a power supply voltage of the semiconductor device, and
wherein the first mode is a mode which prohibits the switching of the power supply voltage.

* * * * *